(12) United States Patent
Shinoda

(10) Patent No.: US 8,724,385 B2
(45) Date of Patent: May 13, 2014

(54) SEMICONDUCTOR DEVICE

(75) Inventor: Tatsuru Shinoda, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 287 days.

(21) Appl. No.: 13/274,899

(22) Filed: Oct. 17, 2011

(65) Prior Publication Data

US 2012/0099384 A1  Apr. 26, 2012

(30) Foreign Application Priority Data

Oct. 20, 2010  (JP) .................................. 2010-235532

(51) Int. Cl.
| | | |
|---|---|---|
| G11C 5/02 | (2006.01) | |
| G11C 5/06 | (2006.01) | |
| G11C 16/00 | (2006.01) | |
| G11C 16/02 | (2006.01) | |
| G11C 16/04 | (2006.01) | |
| G11C 7/18 | (2006.01) | |

(52) U.S. Cl.
USPC ............ 365/185.05; 365/185.06; 365/185.11; 365/185.13; 365/185.16

(58) Field of Classification Search
USPC ............. 365/185.05, 185.06, 185.11, 185.13, 365/185.16
See application file for complete search history.

(56) References Cited

U.S. PATENT DOCUMENTS

| | | | | |
|---|---|---|---|---|
| 5,815,444 | A | * | 9/1998 | Ohta ......................... 365/189.05 |
| 6,744,667 | B2 | * | 6/2004 | Yamamoto et al. ....... 365/185.16 |
| 2002/0125538 | A1 | * | 9/2002 | Abedifard et al. ............. 257/390 |
| 2004/0042295 | A1 | * | 3/2004 | Fujiwara et al. .............. 365/202 |
| 2006/0034141 | A1 | * | 2/2006 | Iioka et al. ............... 365/230.03 |

FOREIGN PATENT DOCUMENTS

JP    2008-047224    2/2008

* cited by examiner

*Primary Examiner* — J. H. Hur
(74) *Attorney, Agent, or Firm* — Volentine & Whit, PLLC

(57) ABSTRACT

A semiconductor memory has main bit lines paralleled by fixed potential lines in an alternating arrangement. Each main bit line is switchably connected to two sub-bit lines. The memory cells connected to one of the two sub-bit lines are placed below the main bit line. The memory cells connected to the other one of the two sub-bit lines are placed below an adjacent fixed potential line. The fixed potential lines prevent parasitic capacitive coupling between the main bit lines and thereby speed up read access to the memory cells without taking up extra layout space.

12 Claims, 6 Drawing Sheets

SEMICONDUCTOR DEVICE

BACKGROUND OF THE INVENTION

1. Field of the Invention

The present invention relates to a semiconductor memory having a plurality of memory cells.

2. Description of the Related Art

Two main types of memory are used to store digital information in electronic devices. One type uses mechanisms such as magnetic or optical disk drives that require physical motion. The other type uses semiconductor memory elements that do not require physical motion. Semiconductor memory can be further classified as volatile, meaning that the stored information is lost when power is switched off, or nonvolatile, meaning that the stored information is retained even while power is off.

In a nonvolatile memory such as an erasable programmable read only memory (EPROM) each memory cell typically has a single charge-storage region. The original or non-programmed state in which no charge is stored in the charge storage region is defined as the '1' state; the written state or programmed state, in which negative charge is stored in the charge storage region, increasing the threshold voltage of the memory cell, is defined as the '0' state. Such a memory cell has, for example, an n-type metal-oxide-semiconductor field-effect transistor (MOSFET) structure including a gate oxide film. The charge storage region is then a floating gate (FG) made of polysilicon, buried in the gate oxide film and electrically isolated from other regions. Such a memory cell can be programmed, read, and erased in, for example, the following way.

To program the memory cell, that is, to write '0' data into the floating gate, positive voltages are applied to the drain and control gate of the memory cell while the source is grounded. With this biasing, electrons traveling in the channel from the source to the drain acquire high kinetic energy in the vicinity of the drain, becoming so-called hot electrons. Some of these hot electrons pass through the gate oxide film and are injected into the floating gate and held there. When the floating gate has stored a sufficient charge in this way, the writing of '0' data is completed.

Since the electrons injected into the floating gate are negatively charged, after the writing operation, the threshold voltage of the memory cell observed at the control gate is higher than before. To read the data in the memory cell, a voltage intermediate between the threshold voltages before and after programming is applied to the control gate, a positive voltage is applied to the drain, and the source is grounded. If the memory cell has been programmed to the '0' state, no current flows through it, because the voltage applied to the control gate is lower than the threshold voltage in the programmed state. If the memory cell has not been programmed and is still in the '1' state, it conducts current because the voltage applied to its control gate is higher than its threshold voltage. The value of the data stored in the memory cell is read by detecting the current or the absence thereof.

To erase the data stored in the memory device, the memory cells are irradiated with, for example, ultraviolet light. This brings the electrons stored in the floating gates into a high energy state, enabling the electrons to escape through the gate oxide films into the substrate and the control gates. The floating gates thereby lose their negative charge and the memory cells are returned to their original non-programmed state.

In Japanese Patent Application Publication No. 2008-47224, Kuramori describes an EPROM in which memory cells of this type are arranged in a matrix to form a memory array and the memory cells in the memory array are connected to amplifiers by bit lines.

In a semiconductor memory, however, since adjacent bit lines are separated by a dielectric material, there is a parasitic capacitance between them, causing the following problem. When one bit line is selected, the voltage change on the selected bit line is coupled through the parasitic capacitance to the adjacent bit lines and the voltage on the adjacent bit lines also changes, causing current to flow on the adjacent bit lines as well as the selected bit line. When current is detected to read a memory cell in a nonvolatile semiconductor memory such as the above EPROM, accordingly, part of the detected current may be due to current flow through adjacent memory cells; it is difficult to detect current depending only on the selected or unselected state and threshold voltage of the intended memory cell. Accordingly, there is the risk of reading data incorrectly due to the effect of the parasitic capacitance between the bit lines. This problem can also occur in volatile semiconductor memory, This problem can be solved by additionally providing, between each pair of adjacent bit lines, a line that is tied to a fixed potential such as the ground potential, but this solution is incompatible with small circuit size. The small form factors of recent non-volatile and volatile semiconductor memories make the insertion of such additional lines between the bit lines extremely difficult.

SUMMARY OF THE INVENTION

An object of the present invention is to provide a semiconductor memory in which the effect of the parasitic capacitance of the bit lines is reduced and high-speed reading of data is possible.

The present invention provides a semiconductor memory having a plurality of memory cells, at least one word line, a plurality of first sub-bit lines, a plurality of second sub-bit lines, and a plurality of selector elements. Each word line is connected to a plurality of memory cells. The sub-bit lines run crosswise to the word line(s) and are also connected to the memory cells. The second sub-bit lines are also connected to a voltage source.

Each selector element has a first terminal and a second terminal, and operates as a switch that interconnects the first and second terminals when switched on and disconnects them when switched off. The first terminals of the selector elements are connected to respective first sub-bit lines.

The plurality of selector elements are divided into mutually adjacent pairs. Each pair is served by one main bit line, which is connected to the second terminals of the mutually adjacent selector elements in the pair. Each main bit line is paralleled by at least one fixed potential line, which is held at a fixed potential. Fixed potential lines preferably alternate with the main bit lines in a single interconnection wiring layer.

The selector elements are switched on and off to connect different memory cells to the main bit lines at different timings. The fixed potential lines reduce the effect of parasitic capacitive coupling between main bit lines and make it possible to read data with high accuracy.

The selector elements enable half of the main bit lines in a conventional semiconductor memory to be replaced by fixed potential lines without reducing the number of memory cells. The fixed potential lines can be laid out in the same ways as the main bit lines they replace, in relation to the memory cells, so the replacement does not alter the size of the semiconductor memory. The selector elements themselves take up comparatively little space. The invention is therefore readily applicable to high-density semiconductor memory devices.

DETAILED DESCRIPTION OF THE INVENTION

Figure 1:
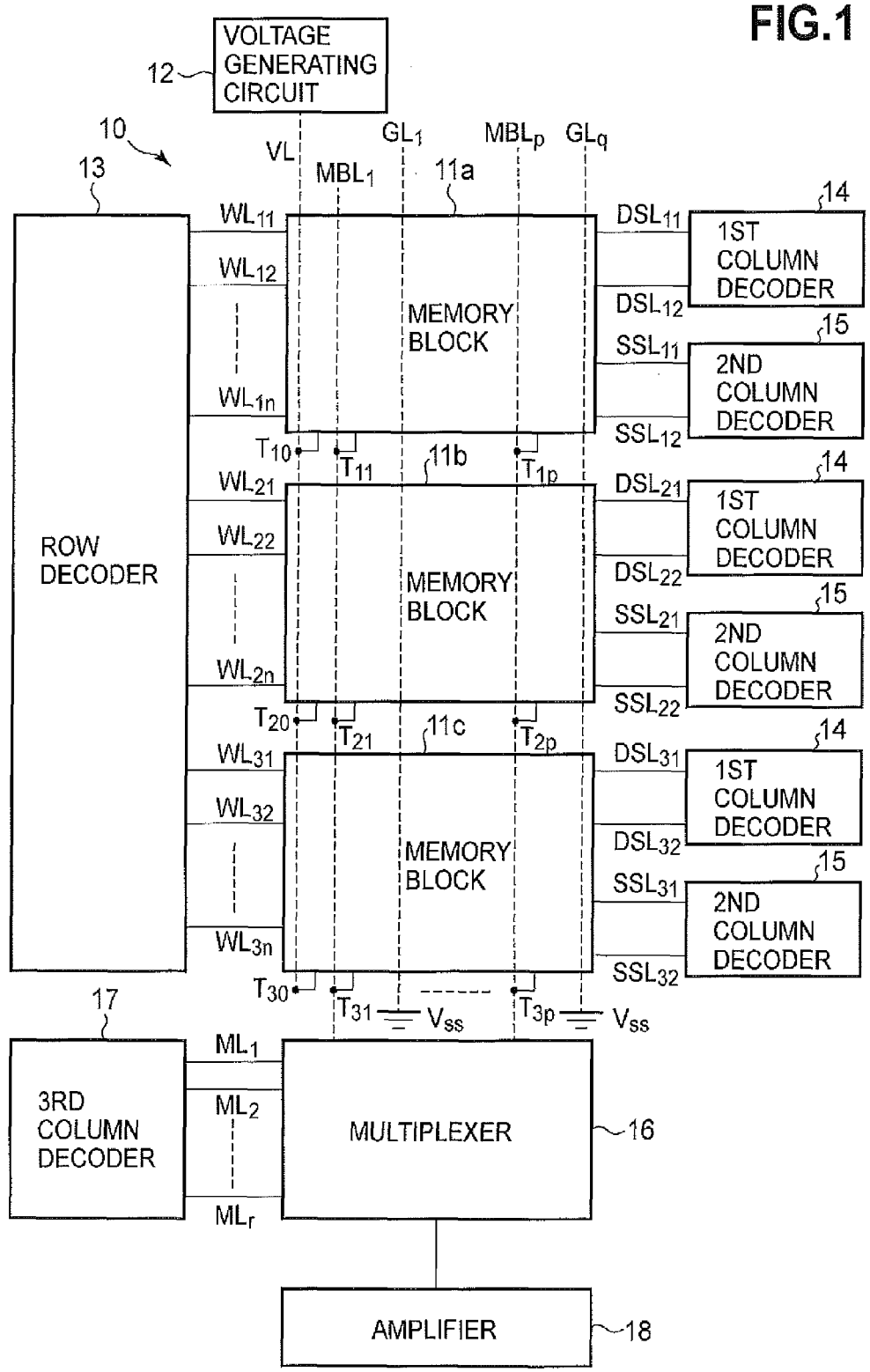
FIG. 1 is a block diagram of a semiconductor memory embodying the invention.

A semiconductor memory embodying the invention will now be described with reference to the attached drawings, in which like elements are indicated by like reference characters.

Referring to the block diagram in FIG. 1, the semiconductor memory 10 includes three memory blocks 11a, 11b, 11c that receive a predetermined voltage from a voltage generating circuit 12. The memory blocks are connected in common to a row decoder 13 and a multiplexer 16, and each memory block is also connected separately to a first column decoder 14 and a second column decoder 15. The multiplexer 16 is connected to a third column decoder 17 and an amplifier 18. The row decoder 13, first column decoders 14, second column decoders 15, and third column decoder 17 function as driving circuits.

The memory blocks 11a, 11b, 11c are connected to the multiplexer 16 via p main bit lines $MBL_1, MBL_2, \ldots, MBL_p$ (where p is a positive integer). Reference characters MBL will be used without subscripts when it is not necessary to identify the main bit lines individually. Each main bit line MBL passes through all p memory blocks. For example, memory block 11a is connected at point $T_{11}$ to main bit line $MBL_1$ and at point $T_{1p}$ to main bit line $MBL_p$. Memory block 11b is connected at point $T_{21}$ to main bit line $MBL_1$ and at point $T_{2p}$ to main bit line $MBL_p$. Memory block 11c is connected at point $T_{31}$ to the main bit line $MBL_1$ and at point $T_{3p}$ to main bit line $MBL_p$.

Ground potential lines $GL_1, GL_2, \ldots, GL_q$ are provided as fixed potential lines between the main bit lines MBL (where q is a positive integer). Reference characters GL will be used without subscripts when it is not necessary to identify the ground potential lines individually. Each ground potential line GL is connected to a ground line or node held at the ground potential $V_{ss}$. The main bit lines MBL alternate with the ground potential lines GL. In the drawings p and q are equal, but this is not a necessary condition. For example, the main bit lines MBL and ground potential lines GL may alternate so that ground potential line $GL_1$ is between main bit line $MBL_1$ and main bit line $MBL_2$ and ground potential line $GL_q$ is between main bit line $MBL_{(p-1)}$ and main bit line $MBL_p$, in which case q is one less than p.

Each of the memory blocks 11a, 11b, 11c is connected through a single common voltage supply line VL to the voltage generating circuit 12. Specifically, the memory blocks 11a, 11b, 11c are connected at respective points $T_{10}, T_{20}, T_{30}$ to the voltage supply line VL.

The row decoder 13 is connected through word lines $WL_{11}, WL_{12}, \ldots, WL_{1n}$ to memory block 11a, through word lines $WL_{21}, WL_{22}, \ldots, WL_{2n}$ to memory block 11b, and through word lines $WL_{31}, WL_{32}, \ldots, WL_{3n}$ to memory block 11c, where n is a positive integer. Reference characters WL will be used without subscripts when it is not necessary to identify the word lines individually.

One first column decoder 14 is connected through drain selector lines $DSL_{11}, DSL_{12}$ to memory block 11a, another first column decoder 14 is connected through drain selector lines $DSL_{21}, DSL_{22}$ to memory block 11b, and another first column decoder 14 is connected through drain selector lines $DSL_{31}, DSL_{32}$ to memory block 11c. Reference characters DSL will be used without subscripts when it is not necessary to identify the drain selector lines individually.

One second column decoder 15 is connected through source selector lines $SSL_{11}, SSL_{12}$ to memory block 11a, another second column decoder 15 is connected through source selector lines $SSL_{21}, SSL_{22}$ to memory block 11b, and another second column decoder 15 is connected through source selector lines $SSL_{31}, SSL_{32}$ to memory block 11c. Reference characters SSL will be used without subscripts when it is not necessary to identify the source selector lines individually.

The third column decoder 17 is connected through multiplexer element selector lines $ML_1, ML_2, \ldots, ML_r$ (where r is an integer greater than unity) to the multiplexer 16. Reference characters ML will be used without subscripts when it is not necessary to identify the multiplexer element selector lines individually.

In the above semiconductor memory 10, there are three memory blocks 11a, 11b, 11c, but the number of memory blocks depends on the storage capacity of the semiconductor memory 10 and is not limited to three.

Figure 2:
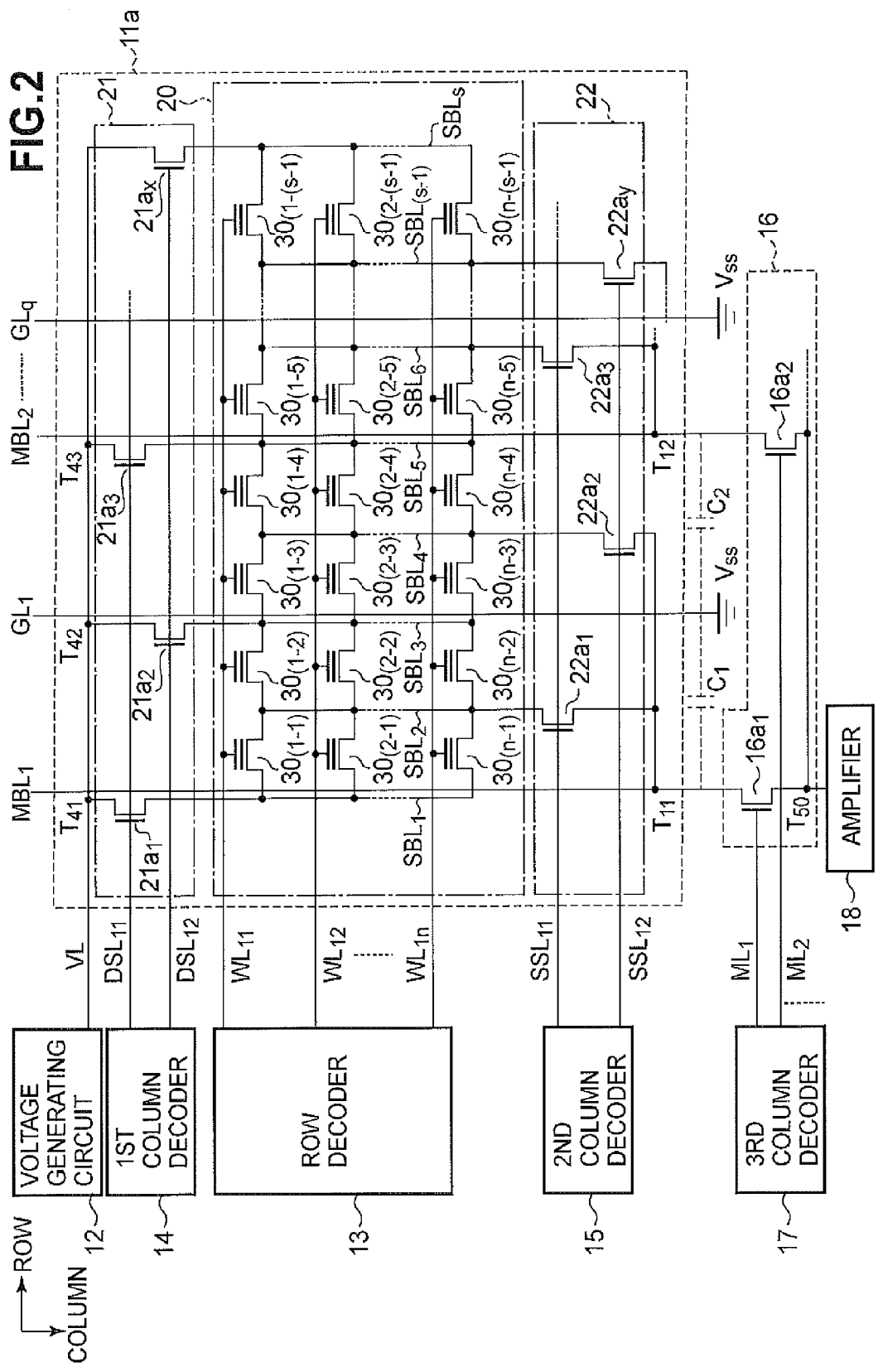
FIG. 2 is a circuit diagram of one memory block in FIG. 1.

Next, referring to FIG. 2, the configurations of the memory blocks 11a, 11b, 11c and the multiplexer 16 and the connection relations of the components shown in FIG. 1 to the components inside the memory blocks 11a, 11b, 11c will be described in detail. All three memory blocks have the same configuration, so FIG. 2 shows memory block 11a as a representative example.

Memory block 11a includes a memory array 20, a drain selector group 21 inserted as a selection circuit between the voltage generating circuit 12 and memory array 20, and a source selector group 22 inserted as another selection circuit between the multiplexer 16 and memory array 20.

The memory array 20 includes sub-bit lines $SBL_1, SBL_2, \ldots, SBL_s$ that cross word lines $WL_{11}, WL_{12}, \ldots, WL_{1n}$. Reference characters SBL will be used without subscripts when it is not necessary to identify the sub-bit lines individually. The sub-bit lines SBL extend in a direction defined as the column direction; the word lines WL extend in a direction defined as the row direction.

Disposed at the intersections of the sub-bit lines SBL and word lines WL are $((s-1) \times n)$ memory cells $30_{(1-1)}, \ldots, 30_{(1-(s-1))}, 3_{(2-1)}, \ldots, 30_{(2-(s-1))}, \ldots, 30_{(n-1)}, \ldots, 30_{(n-(s-1))}$ having an n-type MOSFET structure including a pair of main terminals (source and drain), a control terminal or gate, and a floating gate for storing data. Reference characters 30 will be used without subscripts when it is not necessary to identify the memory cells individually. If, for example, the memory array 20 has nine sub-bit lines SBL (s=9) and eight word lines WL (n=8), then it has sixty-four memory cells 30 $((s-1) \times n = 64)$. The numbers of sub-bit lines SBL, word lines WL, and memory cells 30 are design choices that depend on the memory capacity of the semiconductor memory 10 and the number of memory cells 30 into which data are written simultaneously.

The gates of the memory cells 30 are connected to the word lines WL and the sources and drains of the memory cells 30 are connected to the sub-bit lines SBL. In the present embodiment, for example, the gate, drain, and source of memory cell $30_{(1-1)}$ are connected to word line $WL_1$, sub-bit line $SBL_1$, and sub-bit line $SBL_2$, respectively. The gate, drain, and source of memory cell $30_{(1-2)}$ are connected to word line $WL_1$, sub-bit line $SBL_3$, and sub-bit line $SBL_2$, respectively. In general, in the present embodiment, the sources of the memory cells 30 are connected through even-numbered sub-bit lines SBL to the source selector group 22 and the drains of the memory cells 30 are connected through odd-numbered sub-bit lines SBL to the drain selector group 21, so the source-drain connection order reverses in each column.

The row decoder 13 selects an arbitrary one of the word lines $WL_{11}, \ldots, WL_{1n}, WL_{21}, \ldots, WL_{2n}, WL_{31}, \ldots, WL_{3n}$ and supplies a gate signal at a predetermined voltage level to the selected word line. The memory cells 30 in memory block 11a can be selected when one of word lines $WL_{11}, \ldots, WL_{1n}$ is selected. When word line $WL_{11}$ is selected, for example, the gate signal is supplied to the gates of memory cells $30_{(1-1)}, \ldots 30_{(1-(s-1))}$. Only one word line can be selected at a time, so when word line $WL_{11}$ is selected, none of the word lines in the other memory blocks (memory blocks 11b, 11c) is selected.

The drain selector group 21 comprises x drain selectors $21a_1, 21a_2, \ldots, 21a_x$ having an n-type MOSFET structure (where x is an integer greater than unity). Reference characters 21a will be used without subscripts when it is not necessary to identify the drain selectors individually. The drain selectors 21a are connected through the sub-bit lines SBL to the drains of the memory cells 30. For example, the drain of drain selector $21a_1$ is connected through sub-bit line $SBL_1$ to the drains of memory cells $30_{(1-1)}, 30_{(2-1)}, \ldots, 30_{(n-1)}$. The drain of drain selector $21a_2$ is connected through sub-bit line $SBL_3$ to the drains of memory cells $30_{(1-2)}, 30_{(2-2)}, \ldots, 30_{(n-2)}$ and the drains of memory cells $30_{(1-3)}, 30_{(2-3)}, \ldots, 30_{(n-3)}$. The drain selectors 21a are connected through the voltage supply line VL to the voltage generating circuit 12. For example, the drain of drain selector $21a_1$ is connected at point $T_{41}$ to the voltage supply line VL and through the voltage supply line VL to the voltage generating circuit 12. The odd-numbered drain selectors $21a_1, 21a_3, \ldots, 21a_{(x-1)}$ are connected to the first column decoder 14 by a common drain selector line $DSL_{11}$, and the even-numbered drain selectors $21a_2, 21a_4, \ldots, 21a_x$ are connected to the first column decoder 14 by a common drain selector line $DSL_{12}$.

The first column decoder 14 selects either drain selector line $DSL_{11}$ or drain selector line $DSL_{12}$ and supplies a gate signal to the selected drain selector line to turn on the corresponding drain selectors, allowing the voltage supplied from the voltage generating circuit 12 to reach the drains of the corresponding memory cells 30. When drain selector line $DSL_{11}$ is selected, for example, drain selectors $21a_1, 21a_3, \ldots, 21a_{(x-1)}$ are switched on and a predetermined voltage is supplied through sub-bit lines $SBL_1, SBL_5, \ldots, SBL_{(s-2)}$ to the drains of the memory cells 30 connected to these sub-bit lines. When drain selector line $DSL_{11}$ is selected, the drain selector lines in the other memory blocks 11b, 11c are not selected.

The source selector group 22 comprises y source selectors $22a_1, 22a_2, \ldots, 22a_y$ having an n--type MOSFET structure (where y is an integer greater than unity). Reference characters 22a will be used without subscripts when it is not necessary to identify the source selectors individually. The source selectors 22a are connected through the sub-bit lines SBL to the sources of the memory cells 30. For example, the drain of source selector $22a_1$ is connected through sub-bit line $SBL_2$ to the sources of memory cells $30_{(1-1)}, 30_{(1-2)}, 30_{(2-1)}, 30_{(2-2)}, \ldots, 30_{(n-1)}, 30_{(n-2)}$. The sources of the source selectors 22a are connected pairwise to the main bit lines MBL. For example, the sources of source selectors $22a_1, 22a_2$ are connected at point $T_{11}$ to main bit line $MBL_1$, the sources of source selectors $22a_3, 22a_4$ are connected at point $T_{12}$ to main bit line $MBL_2$, and the sources of source selectors $22a_{(y-1)}, 22a_y$ are connected at point $T_{1p}$ to main bit line $MBL_p$. The gates of source selectors $22a_1, 22a_3, \ldots, 22a_{(y-1)}$ are connected to the second column decoder 15 by a common source selector line $SSL_{11}$, and the gates of source selectors $22a_2, 22a_4, \ldots, 22a_y$ are connected to the second column decoder 15 by a common source selector line $SSL_{12}$.

The second column decoder 15 selects either source selector line $SSL_{11}$ or source selector line $SSL_{12}$ and supplies a gate signal to the selected source selector line to allow currents depending on the states of the memory cells 30 to flow to the multiplexer 16 through the main bit lines MBL. When source selector line $SSL_{11}$ is selected, for example, source selectors $22a_1, 22a_3, \ldots, 22a_{(y-1)}$ are switched on and currents depending on the states of the memory cells 30 selected by the row decoder 13 and first column decoder 14 are supplied to the multiplexer 16 via the main bit lines $MBL_1, MBL_2, \ldots, MBL_p$. When source selector line $SSL_{11}$ is selected, the source selector lines of the other memory blocks (memory blocks 11b, 11c) are not selected.

The multiplexer 16 comprises z multiplexer elements $16a_1, 16a_2, \ldots, 16a_z$ having an n-type MOSFET structure (where z is an integer greater than unity). Reference characters 16a will be used without subscripts when it is not necessary to identify the multiplexer elements individually. The multiplexer elements 16a are connected to the source selectors 22a via the main bit lines MBL. For example, the drain of multiplexer element $16a_1$ is connected to the sources of source selectors $22a_1, 22a_2$ via main bit line $MBL_1$ and point $T_{11}$, and the drain of multiplexer element $16a_2$ is connected to the sources of source selectors $22a_3, 22a_4$ via main bit line $MBL_2$ and point $T_{12}$. The sources of the multiplexer elements 16a are connected to the amplifier 18 via point $T_{50}$. The gates of the multiplexer elements 16a are connected to the third column decoder 17 by multiplexer element selection lines $ML_1, ML_2, \ldots, ML_r$.

The third column decoder 17 selects one of the multiplexer element selection lines $ML_1, ML_2, \ldots, ML_r$ and supplies a gate signal to the selected multiplexer element selection line ML to switch on one of the multiplexer elements $16a_1, 16a_2, \ldots, 16z$, thereby supplying current from the corresponding one of the main bit lines $MBL_1$ to $MBL_p$ to the amplifier 18. For example, when multiplexer element selection lines $ML_1$ is selected, multiplexer element $16a_1$ is switched on and a current depending on the state of the memory cell 30 selected by the row decoder 13, first column decoder 14, and second column decoder 15 is supplied through main bit line $MBL_1$ to the multiplexer 16.

The amplifier 18 is connected to the sources of the multiplexer elements 16a. When the current depending on the state of the memory cell 30 selected by the row decoder 13, first column decoder 14, and second column decoder 15 is supplied to the amplifier 18 via the multiplexer 16, the amplifier 18 determines the data stored in the memory cell 30 according to the amount of the supplied current. Specifically, the amplifier 18 recognizes the data stored in the memory cell 30 as '0' when the supplied current value is less than a predetermined value and recognizes the data stored in the memory cell 30 as '1' when the supplied current value is the predetermined value or more.

As seen in FIGS. 1 and 2, the main bit lines MBL are disposed alternately with the ground potential lines GL, and as shown later, they are separated from the ground potential lines GL by a dielectric material, so parasitic capacitances occur between the main bit lines MBL and ground potential lines GL. For example, there is a parasitic capacitance C1 between main bit line $MBL_1$ and ground potential line $GL_1$, and a parasitic capacitance C2 between main bit line $MBL_2$ and ground potential line $GL_1$.

The sub-bit lines $SBL_2$, $SBL_4$, . . . , $SBL_{(s-1)}$ connected to the source selectors 22a are defined as first sub-bit lines. The sub-bit lines $SBL_1$, $SBL_3$, . . . , $SBL_s$ connected to the drain selectors 21a are defined as second sub-bit lines.

The structure of the memory cells 30 constituting the semiconductor memory 10 and methods for writing data into, reading data from, and erasing data from the memory cells 30 will be described with reference to FIG. 3.

Figure 3:
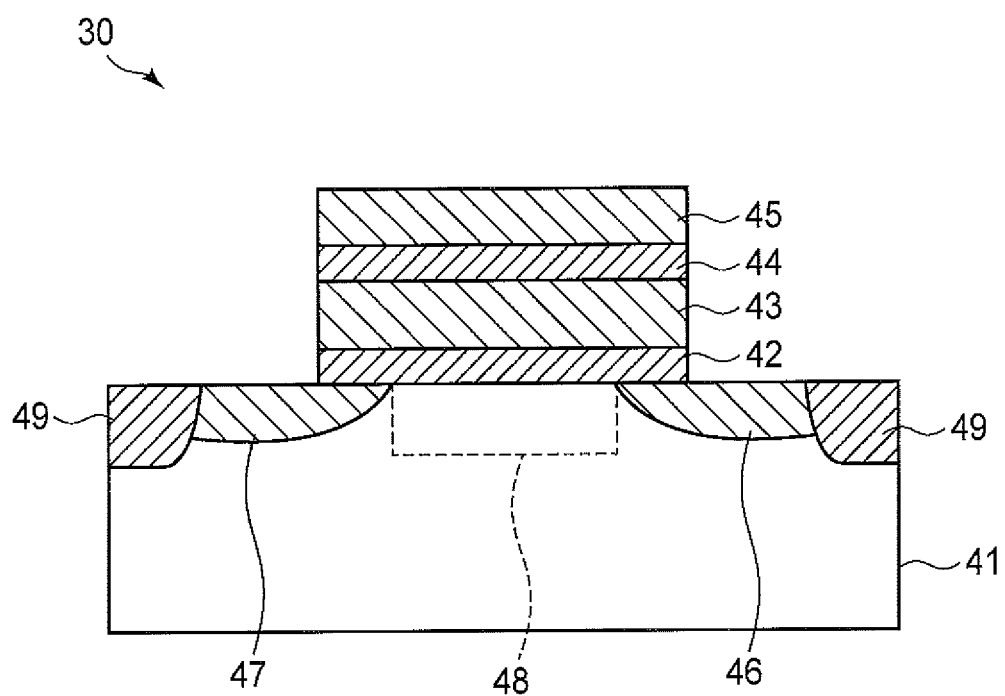
FIG. 3 is a sectional view of a memory cell in FIG. 2.

The memory cell 30 shown in FIG. 3 is an n-type MOSFET having a stacked gate structure in which a first gate oxide film 42 made of $SiO_2$, a floating gate 43 made of polysilicon, a second gate oxide film 44 made of $SiO_2$, and a control gate 45 made of polysilicon are stacked on the upper surface of a p-type silicon substrate 41. A source region 46 and a drain region 47, both of which are heavily doped with an n-type impurity, are formed in the surface of the silicon substrate 41 on mutually opposite sides of the first gate oxide film 42. The surface region of the silicon substrate 41 immediately below the first gate oxide film 42 is a channel region 48 in which a current path is formed when the memory cell 30 is in the conductive state. The source region 46, drain region 47, and channel region 48 are surrounded by field oxide regions 49.

To program the memory cell 30, a positive voltage (for example, +12 V) is applied to the control gate 45 and another positive voltage (for example, +6 V) is applied to the drain region 47 while the source region 46 and the silicon substrate 41 are set to the ground potential (0 V). With this biasing, electrons traveling from the source region 46 to the drain region 47 in the channel region 48 acquire a high kinetic energy in the vicinity of the drain region 47, becoming hot electrons, some of which pass through the first gate oxide film 42 and are injected into the floating gate 43. The negative charge of the injected electrons gives the floating gate 43 a negative potential, so that the threshold voltage $V_{TM1}$ of the memory cell 30 measured at the control gate 45 after the data writing becomes higher than the initial threshold voltage $V_{TM0}$ of the memory cell 30. This state in which the threshold voltage $V_{TM1}$ is higher than the threshold voltage $V_{TM0}$ corresponds to the state in which a '0' is written in the memory cell 30.

To read the data stored in the memory cell 30, a voltage intermediate between threshold voltages $V_{TM1}$ and $V_{TM0}$ is applied to the control gate 45 and the stored data value is determined from whether the memory cell 30 turns on (conducts current) or remains in the off-state (does not conduct). If a '0' has been written in the memory cell 30, its threshold voltage $V_{TM1}$ is higher than the initial threshold voltage $V_{TM0}$ ($V_{TM1} > V_{TM0}$), so application of a voltage intermediate between $V_{TM0}$ and $V_{TM1}$ to the control gate 45 fails to turn on the memory cell 30 and no current flows through the memory cell 30. If the memory cell 30 has not been programmed and still stores a '1', it still has its original threshold voltage $V_{TM0}$, so the application of a voltage intermediate between $V_{TM0}$ and $V_{TM1}$ and thus higher than $V_{TM0}$ to the control gate 45 brings the memory cell 30 into the on-state and allows current to flow through the memory cell 30. The entire read operation may be performed by setting the source region 46 and the silicon substrate 41 to the ground potential (0 V), applying a positive voltage of +5 V to the control gate 45 and a positive voltage of +1.5 V to the drain region 47, and detecting the resulting flow of current or absence thereof.

The data in the memory cells 30 can be erased as described above by irradiating the semiconductor memory 10 with ultraviolet light, thereby giving the electrons (if any) stored in the floating gate 43 of each memory cell 30 enough energy to escape through the gate oxide films 42, 44 into the silicon substrate 41 and control gate 45, so that the threshold voltage of the programmed memory cells returns to the initial threshold voltage $V_{TM0}$. All memory cells 30 are erased simultaneously.

The present embodiment is not limited to the structure in FIG. 3, in which the memory cell 30 has a single floating gate 43 and the threshold voltage of the memory cell 30 is changed by storing charge in the floating gate 43. The present embodiment is applicable to any type of memory cell that is programmed by changing its threshold voltage.

Next, the positional relationships among the main bit lines MBL, sub-bit lines SBL, and memory cells 30 will be described with reference to FIGS. 4 and 5.

Figure 4:
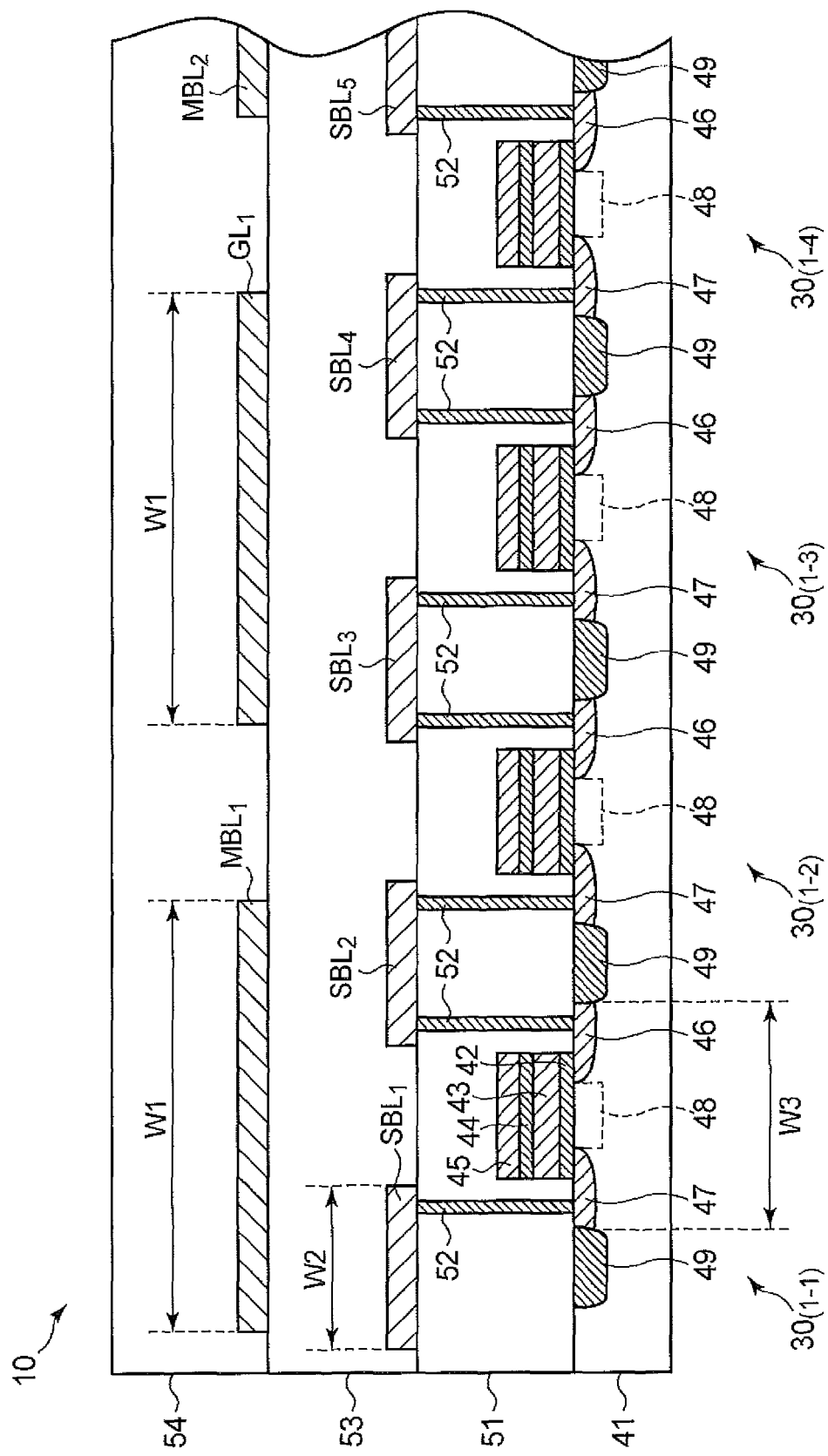
FIG. 4 is an enlarged sectional view of part of the memory block in FIG. 2.

Referring to FIG. 4, the sources 46 and drains 47 of the memory cells 30 are connected through contact plugs 52 passing through a first interlayer dielectric film 51 to the sub-bit lines SBL, which are formed on the first interlayer dielectric film 51. The sub-bit lines SBL are covered by a second interlayer dielectric film 53. The main bit lines MBL and ground potential lines GL are disposed on the second interlayer dielectric film 53 and are covered by a third interlayer dielectric film 54. The control gates 45 are connected by gate contact plugs (not shown) passing through the first interlayer dielectric film 51 to the word lines WL (not shown), which are formed on the first interlayer dielectric film 51 or in a separate wiring layer (not shown).

Figure 5:
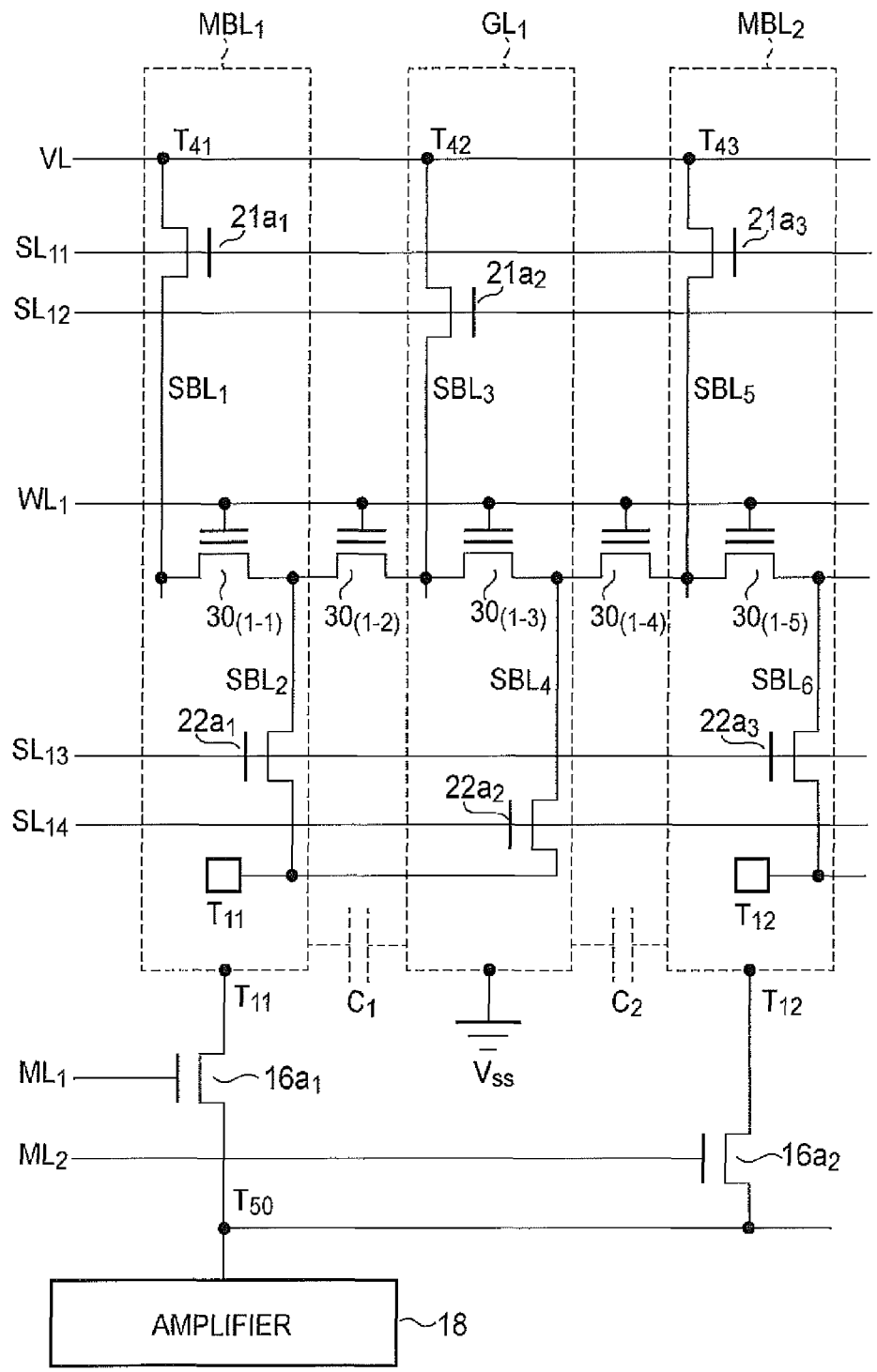
FIG. 5 is a schematic circuit diagram illustrating the positional relationships of the main bit lines and memory cells in FIG. 2.

As seen in FIGS. 4 and 5, each main bit line MBL and each ground potential line GL is formed directly above two sub-bit lines SBL and the memory cells 30 surrounded by these two sub-bit lines. As a specific example, main bit line $MBL_1$ passes directly above memory cell $30_{(1-1)}$ and its adjacent sub-bit lines $SBL_1$, $SBL_2$. Ground potential line $GL_1$ passes directly above memory cell $30_{(1-3)}$ and its adjacent sub-bit lines $SBL_3$, $SBL_4$. That is, when the memory cells 30 are viewed looking from the third interlayer dielectric film 54 toward the silicon substrate 41, main bit line $MBL_1$ overlaps memory cell $30_{(1-1)}$ and sub-bit lines $SBL_1$, $SBL_2$, while ground potential line $GL_1$ overlaps memory cell $30_{(1-3)}$ and sub-bit lines $SBL_3$, $SBL_4$. Main bit line $MBL_1$ thus faces memory cell $30_{(1-1)}$ through the first interlayer dielectric film 51 and second interlayer dielectric film 53, and faces sub-bit lines $SBL_1$, $SBL_2$ through the second interlayer dielectric film 53. Ground potential line $GL_1$ faces memory cell $30_{(1-3)}$ through the first interlayer dielectric film 51 and second interlayer dielectric film 53, and faces sub-bit lines $SBL_3$, $SBL_4$ through the second interlayer dielectric film 53.

The main bit lines MBL and ground potential lines GL have the same width W1. The width W1 of the main bit lines MBL and ground potential lines GL is wider than the width W2 of the sub-bit lines, e.g., about three times width W2. The width W1 of the main bit lines MBL and ground potential lines GL is also wider than the width W3 of the region in which each memory cell 30 is formed, e.g., about two times width W3. That is, among the circuit elements and wiring constituting the semiconductor memory 10, the main bit lines MBL and ground potential lines GL have particularly large dimensions and occupy a large area in the semiconductor memory 10.

Referring to FIG. 5, first sub-bit lines $SBL_2$ and $SBL_4$ are connected through source selectors $22a_1$, $22a_2$ and point $T_{11}$ to main bit line $MBL_1$. This structure allows current to flow through main bit line $MBL_1$ when one of memory cells $30_{(1-1)}$, $30_{(1-2)}$, $30_{(1-3)}$, $30_{(1-4)}$ is in the on-state. That is, main bit line $MBL_1$ functions as a common main bit line shared by four memory cells $30_{(1-1)}$, $30_{(1-2)}$, $30_{(1-3)}$, $30_{(1-4)}$. Since the source selectors $22a_1$, $22a_2$ through which main bit line $MBL_1$ is connected to sub-bit lines $SBL_2$, $SBL_4$ are switched on and off at mutually different timings, the currents on sub-bit lines $SBL_2$ and $SBL_4$ are never supplied to main bit line $MBL_1$ simultaneously.

Connecting two sub-bit lines SBL to one common main bit line MBL as described above makes it possible to halve the number of main bit lines MBL, compared with a conventional memory in which only one sub-bit line SBL in each memory block is connected to each main bit line MBL. In the present embodiment, the wires not used as main bit lines MBL are connected to the ground potential $V_{ss}$ and used as ground potential lines GL. Therefore, the layout relationship of main bit line $MBL_1$ to the memory cells $30_{(1-1)}$, $30_{(2-1)}$ positioned directly below it is the same as the layout relationship of ground potential line $GL_1$ to the memory cells $30_{(1-3)}$, $30_{(1-3)}$ positioned directly below it. The term 'layout relationship' refers to the positional relationship of the main bit lines MBL and ground potential lines GL with respect to the memory cells 30. The layout relationships of the other main bit lines MBL and ground lines GL to the memory cells 30 are similar.

Since the ground potential lines GL, which are positioned between adjacent main bit lines MBL, are connected to the ground potential $V_{ss}$, they remain at a constant voltage level despite voltage level variations on the main bit lines MBL, the parasitic capacitances between the main bit lines MBL and the ground potential lines GL notwithstanding. In particular, the voltage variations accompanying current flow on a main bit line MBL are masked by the adjacent ground potential lines GL and are not coupled to other main bit lines MBL. This reduces the effect of the parasitic capacitance between the main bit lines MBL and makes it possible to read data with high accuracy.

The fixed potential at which the wires positioned between the main bit lines MBL are held is not limited to the ground potential shown in the present embodiment. Any fixed potential can perform the same function of preventing voltage level variations on one main bit line from being capacitively coupled to other main bit lines MBL, thereby enabling data to be read with high accuracy. Nor is it necessary to hold all the fixed potential lines between the main bit lines MBL at the same potential, provided the potential of each line is held fixed.

Figure 6:
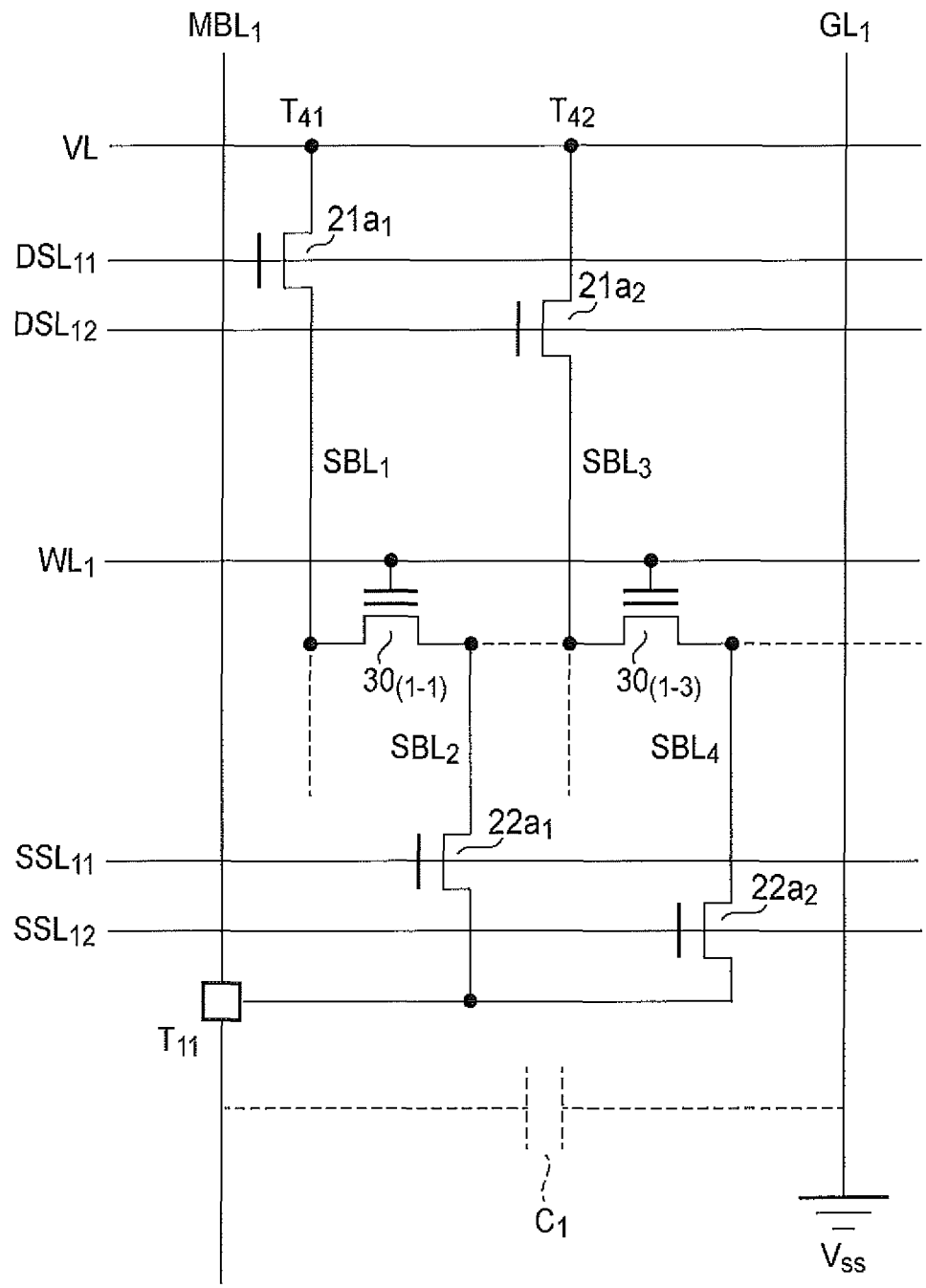
FIG. 6 is a schematic circuit diagram used to describe the operation of the semiconductor memory in FIG. 1.

Next, the reading of data from two memory cells will be described with reference to FIGS. 2 and 6. In the following description, word line $WL_1$ is selected and the data stored in the two memory cells $30_{(1-1)}$ and $30_{(1-3)}$ shown in FIG. 6 are read. It will be assumed that memory cell $30_{(1-1)}$ stores '1' data and memory cell $30_{(1-3)}$ stores '0' data.

To read the data stored in memory cell $30_{(1-1)}$, a predetermined voltage is applied through word line $WL_1$ to the control gate 45 of memory cell $30_{(1-1)}$. The predetermined voltage has a voltage value intermediate between the initial threshold voltage $V_{TM0}$ of the memory cells in the non-programmed state and the threshold voltage $V_{TM1}$ in the programmed state, in which a '0' has been written. Next, a gate voltage is supplied through drain selector line $DSL_{11}$ to the gate of drain selector $21a_1$ to switch on drain selector $21a_1$, and a predetermined voltage generated in the voltage generating circuit 12 is applied to the drain region 47 of memory cell $30_{(1-1)}$. Subsequently, a gate voltage is supplied through source selector line $SSL_{11}$ to the gate of source selector $22a_1$ to switch on source selector $22a_1$. A gate voltage is also supplied through multiplexer element selection line $ML_1$ to the gate of multiplexer element $16a_1$ to switch on multiplexer element $16a_1$. Since a '1' is stored in memory cell $30_{(1-1)}$, the voltage supplied to the control gate 45 is higher than the threshold voltage of memory cell $30_{(1-1)}$, so current flows through the multiplexer 16 to the amplifier 18. By detecting this current, the amplifier 18 recognizes the data stored in memory cell $30_{(1-1)}$ as a '1'.

During this read operation, the voltage level on main bit line $MBL_1$ may vary due to the current flow on main bit line $MBL_1$, but since ground potential line $GL_1$ is connected to the ground potential $V_{ss}$, the voltage level on ground potential line $GL_1$ does not vary due to parasitic capacitive coupling.

To read the data stored in memory cell $30_{(1-3)}$, the same predetermined voltage is applied through word line $WL_1$ to the control gate 45 of memory cell $30_{(1-3)}$, but a gate voltage is supplied through drain selector line $DSL_{12}$ to the gate of drain selector $21a_2$ to switch on drain selector $21a_2$, and the predetermined voltage generated in the voltage generating circuit 12 is applied to the drain region 47 of the memory cell $30_{(1-3)}$. When a gate voltage is supplied through source selector line $SSL_{12}$ to the gate of source selector $22a_2$ to switch on source selector $22a_2$ and a gate voltage is supplied through multiplexer element selection line $ML_1$ to the gate of multiplexer element $16a_1$ to switch on multiplexer element $16a_1$, since a '0' is stored in memory cell $30_{(1-3)}$, the voltage supplied to the control gate 45 is lower than the threshold voltage of memory cell $30_{(1-3)}$, so no current flows through the multiplexer 16. By detecting the absence of current flow, the amplifier 18 determines that a '0' is stored in memory cell $30_{(1-3)}$.

In the embodiment described above, the semiconductor memory 10 has been described as a non-volatile semiconductor memory, but the invention is not limited to non-volatile semiconductor memory. The semiconductor memory 10 may be a volatile semiconductor memory.

Those skilled in the art will recognize that further variations are possible within the scope of the invention, which is defined in the appended claims.

What is claimed is:

1. A semiconductor memory comprising:
a plurality of memory cells for storing data;
at least one word line connected to a plurality of the memory cells;
a plurality of first sub-bit lines running crosswise to the at least one word line, each first sub-bit line being connected to at least one of the memory cells;
a plurality of second sub-bit lines running crosswise to the at least one word line, each second sub-bit line being connected to at least one of the memory cells;
a plurality of selector elements having respective first terminals and respective second terminals, the first terminals being connected to respective ends of the plurality of first sub-bit lines;
at least one main bit line connected to the second terminals of two mutually adjacent selector elements;
at least one fixed potential line paralleling the at least one main bit line;
a voltage generating circuit connected to the second sub-bit lines;

a first dielectric layer on which the first sub-bit lines and the second sub-bit lines are disposed; and a second dielectric layer covering the first dielectric layer, the at least one main bit line and the at least one fixed potential line being disposed on the second dielectric layer, wherein each memory cell in the plurality of memory cells is connected to one of the first sub-bit lines and one of the second sub-bit lines, first sets each including the one of the first sub-bit lines, the one of the second sub-bit lines and the memory cells disposed therebetween are positioned directly below and overlapped by one said main bit line through the second dielectric layer, second sets each including the one of the first sub-bit lines, the one of the second sub-bit lines and the memory cells disposed therebetween are positioned directly below and overlapped by one said fixed potential line through the second dielectric layer, and the first sets and the second sets are arranged in a direction perpendicular to the main bit line alternately.

2. The semiconductor memory of claim 1, further comprising a driving circuit for switching the two mutually adjacent selector elements connected to each main bit line on at different timings.

3. The semiconductor memory of claim 1, wherein the plurality of memory cells are distributed among a plurality of memory blocks, each memory block in the plurality of memory blocks having its own at least one word line, its own first sub-bit lines, its own second sub-bit lines, and its own selector elements, the at least one main bit line being shared by all of the memory blocks, each said main bit line being connected to the second terminals of two mutually adjacent selector elements in every one of the memory blocks.

4. The semiconductor memory of claim 1, further comprising an amplifier for reading the data stored in the memory cells by detecting presence or absence of current flow on the at least one main bit line.

5. The semiconductor memory of claim 1, wherein each memory cell in the plurality of memory cells further comprises:

a first main terminal connected to one of the first sub-bit lines;

a second main terminal connected to one of the second sub-bit lines; and a control terminal connected to one said word line, for controlling current conduction between the first main terminal and the second main terminal responsive to a voltage on said word line and the data stored in the memory cell.

6. The semiconductor memory of claim 1, wherein the memory cells include metal-oxide-semiconductor (MOS) transistors.

7. The semiconductor memory of claim 1, wherein the selector elements are MOS transistors.

8. The semiconductor memory of claim 1, wherein one of the two first sub-bit lines connected to each said two mutually adjacent selector elements is disposed facing one said main bit line through the second dielectric layer.

9. The semiconductor memory of claim 8, wherein another one of the two first sub-bit lines connected to each said two mutually adjacent selector elements is disposed facing one said fixed potential line through the second dielectric layer.

10. The semiconductor memory of claim 1, wherein the at least one main bit line and the at least one fixed potential line comprise a plurality of main bit lines and a plurality of fixed potential lines disposed in mutual alternation, all mutually parallel.

11. The semiconductor memory of claim 1, wherein the at least one fixed potential line is connected to a ground potential.

12. The semiconductor memory of claim 1 wherein, of the memory cells connected to the two first sub-bit lines connected to each said two mutually adjacent selector elements, the memory cells connected to a first one of the two first sub-bit lines are positionally related to one said main bit line in a manner identical to a manner in which the memory cells connected to a second one of the two first sub-bit lines are positionally related to one said fixed potential line.

* * * * *